United States Patent
Haruna

(10) Patent No.: US 11,597,858 B1
(45) Date of Patent: Mar. 7, 2023

(54) CONDUCTIVE ADHESIVE

(71) Applicant: Tatsuta Electric Wire & Cable Co., Ltd., Osaka (JP)

(72) Inventor: Yuusuke Haruna, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 17/783,918

(22) PCT Filed: Jul. 14, 2021

(86) PCT No.: PCT/JP2021/026413
§ 371 (c)(1),
(2) Date: Jun. 9, 2022

(87) PCT Pub. No.: WO2022/024757
PCT Pub. Date: Feb. 3, 2022

(30) Foreign Application Priority Data

Jul. 31, 2020 (JP) .............................. JP2020-130313

(51) Int. Cl.
| | | |
|---|---|---|
| *C09J 9/02* | (2006.01) | |
| *H05K 3/32* | (2006.01) | |
| *C09J 201/00* | (2006.01) | |
| *C09J 11/04* | (2006.01) | |

(52) U.S. Cl.
CPC ................. *C09J 9/02* (2013.01); *C09J 11/04* (2013.01); *C09J 201/00* (2013.01); *H05K 3/321* (2013.01)

(58) Field of Classification Search
CPC . C09J 9/02; C09J 11/04; C09J 201/00; H05K 3/321
See application file for complete search history.

(56) References Cited

FOREIGN PATENT DOCUMENTS

| JP | 3561748 B2 * | 9/2004 |
|---|---|---|
| JP | 2006298954 A | 11/2006 |
| JP | 2009218443 A | 9/2009 |
| JP | 2013041869 A | 2/2013 |

OTHER PUBLICATIONS

Decision to Grant a Patent dated Feb. 17, 2022, issued in Japanese Application No. 2022-506844.
International Search Report dated Oct. 19, 2021, issued in International Application No. PCT/JP2021/026413.
Written Opinion dated Oct. 19, 2021, issued in International Application No. PCT/JP2021/026413.

* cited by examiner

*Primary Examiner* — Mark Kopec
*Assistant Examiner* — Jaison P Thomas
(74) *Attorney, Agent, or Firm* — United IP Counselors, LLC; Kenneth Fagin

(57) ABSTRACT

There is provided a conductive adhesive with which the connection stability between objects that are conductive members is excellent, the connection stability is maintained even when the conductive adhesive is subjected to high temperature, and rising towards the back side of an object is less likely to occur.
A conductive adhesive 1 includes a binder component 12, and metal particles (A) 11 having a 20% compressive strength of 25 MPa or less in a 170° C. environment. The metal particles 11 preferably include a metal having a melting point of 280° C. or less. The content of the metal having a melting point of 280° C. or less in the metal particles (A) 11 is preferably 80% by mass or more.

14 Claims, 1 Drawing Sheet

CONDUCTIVE ADHESIVE

TECHNICAL FIELD

The present disclosure relates to a conductive adhesive.

BACKGROUND ART

Printed circuit boards are frequently used in electronic apparatuses such as cellular phones, video cameras, and notebook computers in order to incorporate circuits into the mechanisms. In addition, printed circuit boards are also utilized for the connection of movable portions such as printer heads to control portions. In these electronic apparatuses, electromagnetic wave shielding measures are essential, and also for the printed circuit boards used in the apparatuses, shielded printed circuit boards subjected to electromagnetic wave shielding measures are used.

The shielded printed circuit boards have, for example, a structure in which an electromagnetic wave shielding film is placed on a substrate film including a printed circuit so that the adhesive face of the electromagnetic wave shielding film in which an adhesive (adhesive layer), a metal thin film, and an insulating layer are stacked in this order adheres closely, and subsequently the adhesive adheres to the substrate film by heating and pressurization (thermocompression bonding).

The printed circuit boards are used with electronic components mounted. For printed circuit boards, flexible printed circuit boards (FPCs) that are bendable are known. For printed circuit boards used for FPCs, electronic components are likely to fall off when the sites on which the electronic components are mounted bend sharply, and therefore for the purpose of preventing this, reinforcing members may be provided on the printed circuit boards. For the reinforcing members, reinforcing members having conductivity that can be grounded to external potentials may be used for the purpose of allowing electromagnetic waves that enter or are produced in printed circuit boards to escape externally. For example, Patent Literature 1 discloses a printed circuit board with a reinforcing member including a reinforcing member having conductivity and a conductive adhesive.

CITATION LIST

Patent Literature

Patent Literature 1: Japanese Patent Laid-Open No. 2013-41869

SUMMARY OF INVENTION

Technical Problem

As conductive adhesives (conductive adhesive sheets) used in conventional printed circuit boards with reinforcing members, isotropic conductive adhesives excellent in the conductivity between a ground circuit and a reinforcing member on the ground side are frequently used. The isotropic conductive adhesives include a large amount of conductive particles, but from an economic viewpoint, the amount of the conductive particles used in the conductive adhesives is preferably small.

However, when a conductive adhesive is used by laminating it by thermocompression bonding so as to cover an opening provided in an insulating layer on a printed circuit board surface, as in the printed circuit board disclosed in Patent Literature 1, the amount of the conductive particles filling the opening is insufficient, and the conductivity between the ground circuit and the reinforcing member on the ground side decreases, and the connection stability tends to be poor, with an anisotropic conductive adhesive in which the amount of the conductive particles in the conductive adhesive is small. In addition, there have been cases where even when the initial connection stability is good, the conductivity decreases when the conductive adhesive is subjected to high temperature in a reflow step or the like.

For the purpose of improving conductivity, using particles having a large particle diameter or dendritic particles as conductive particles is considered. However, when these particles are used in a conventional conductive adhesive, the particles are pushed in due to the thermocompression bonding and rise towards the back side of the base member on which the ground circuit is formed, and the smoothness of the base member is impaired, which may interfere with close adhesiveness when subsequently a component is mounted on the base member.

Therefore, it is an object of the present disclosure to provide a conductive adhesive with which the connection stability between objects that are conductive members is excellent, the connection stability is maintained even when the conductive adhesive is subjected to high temperature, and rising towards the back side of an object is less likely to occur.

Solution to Problem

The present disclosure provides a conductive adhesive including a binder component, and metal particles having a 20% compressive strength of 25 MPa or less in a 170° C. environment.

The 20% compressive strength of the metal particles in a 170° C. environment may be 1 MPa or more.

The metal particles preferably include a metal having a melting point of 300° C. or less.

The content of the metal having a melting point of 300° C. or less in the metal particles is preferably 80% by mass or more.

The content of the metal particles is preferably 10 to 70% by mass.

The metal particles preferably include tin and a metal having a higher melting point than tin as constituent metals.

The metal having a higher melting point than tin may include bismuth, indium, gold, silver, copper, platinum, nickel, palladium, or antimony.

The metal particles are preferably spherical.

The median diameter of the metal particles is preferably 1 to 50 μm.

The metal particles preferably include tin-containing alloy particles.

The conductive adhesive is preferably for a printed circuit board.

It is preferable that the metal particles partially protrude from the adhesive, and the thickness of the adhesive is 10 to 30% of the median diameter of the metal particles.

The conductive adhesive may have a thick film portion and a thin film portion, the thickness of the adhesive in the thick film portion may be 50% or more of the maximum particle diameter of the metal particles in an adhesive thickness direction in the thick film portion, and the thickness of the adhesive in the thin film portion may be 50% or more of the maximum particle diameter of the metal particles in the adhesive thickness direction in the thin film portion.

In addition, the present disclosure provides a printed circuit board with a reinforcing member, including a printed circuit board, the conductive adhesive provided on the printed circuit board, and a reinforcing member having conductivity provided on the conductive adhesive, wherein the printed circuit board has a base member, a circuit pattern partially provided on a surface of the base member, an insulating protective layer covering and insulating and protecting the circuit pattern, and an adhesive for covering the circuit pattern and adhering the circuit pattern and the base member to the insulating protective layer, the circuit pattern includes a plurality of signal circuits and a ground circuit, an opening passing through the adhesive and the insulating protective layer in the thickness direction is formed in the adhesive and the insulating protective layer on the ground circuit, and the conductive adhesive is adhered to the insulating protective layer surface of the printed circuit board so as to cover and block the opening, and the thick film portion of the conductive adhesive fills the opening.

It is preferable that in the thick film portion, the metal particles are in contact with the reinforcing member and the ground circuit, and in the thin film portion, the metal particles are in contact with the reinforcing member and the insulating protective layer.

Advantageous Effects of Invention

For the conductive adhesive of the present disclosure, the connection stability between objects that are conductive members is excellent, the connection stability is maintained even when the conductive adhesive is subjected to high temperature, and rising towards the back side of an object is less likely to occur. Therefore, for example, when the conductive adhesive of the present disclosure is used for the adhesion of a ground circuit and a reinforcing member on the ground side, the connection stability between the ground circuit and the reinforcing member on the ground side is excellent, and rising towards the back side of the base member on which the ground circuit is formed is less likely to occur. For such effects, the effects are achieved, of course when the amount of conductive particles such as metal particles blended is large, and even when the amount is small and economically excellent.

DESCRIPTION OF EMBODIMENTS

[Electrically Conductive Adhesive]

The conductive adhesive of the present disclosure includes at least a binder component, and metal particles having a 20% compressive strength of 25 MPa or less in a 170° C. environment. For each of the binder component and the metal particles, only one type may be used, or two or more types may be used. As used herein, the metal particles having a 20% compressive strength of 25 MPa or less in a 170° C. environment are sometimes referred to as "metal particles (A)". The conductive adhesive may include other conductive particles other than the metal particles (A).

The conductive adhesive may be an anisotropic conductive adhesive or an isotropic conductive adhesive. For example, the conductive adhesive is an anisotropic conductive adhesive when the metal particles (A) mainly have conductivity in the conductive adhesive, and the conductive adhesive is an isotropic conductive adhesive when the metal particles (A) and other conductive particles (for example, metal particles (B) described later) are blended in good balance.

Figure 1:
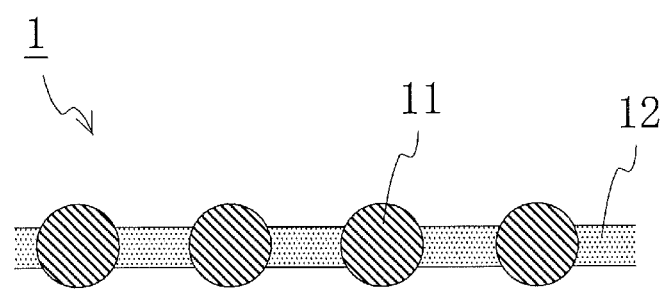
FIG. 1 is a cross-sectional view showing one embodiment of the conductive adhesive of the present disclosure.

FIG. 1 shows one embodiment of the conductive adhesive (adhesive layer) of the present disclosure. A conductive adhesive 1 is layered (sheet-shaped) and includes a binder component 12 and metal particles (A) 11. The metal particles (A) 11 protrude from the surfaces of the adhesive composed of the binder component 12.

(Metal Particles (A))

The metal particles (A) have conductivity. Thus, the conductive adhesive has conductivity. The 20% compressive strength of the metal particles (A) in a 170° C. environment is 25 MPa or less, preferably 23 MPa or less, and more preferably 22 MPa or less. The 20% compressive strength is 25 MPa or less, and thus when high pressure is applied in a 170° C. environment, the metal particles (A) are likely to be compressively deformed, and the metal particles (A) are less likely to rise towards the back side of an object even if pushed in. The 20% compressive strength of the metal particles (A) is measured in accordance with JIS Z 8844: 2019.

The 20% compressive strength of the metal particles (A) in a 170° C. environment may be 1.0 MPa or more, and may be 5.0 MPa or more or 11 MPa or more. When the 20% compressive strength is 1.0 MPa or more, the metal particles (A) are not too compressed when high pressure is applied in a 170° C. environment, and the particle shape can be maintained, and the connection stability between objects is better. Such effects are exhibited particularly when the conductive adhesive is an anisotropic conductive adhesive.

The metal particles (A) preferably include at least a metal having a melting point of 280° C. or less as a constituent metal. Examples of the metal having a melting point of 280° C. or less include tin, bismuth, indium, and alloys thereof. Among them, the metal particles (A) preferably include tin as a constituent metal. Only one of the metal having a melting point of 280° C. or less may be used, or two or more of the metals having a melting point of 280° C. or less may be used. The metal particles (A) may be an alloy of the above-described metal. As used herein, the metal having a melting point of 280° C. or less is sometimes referred to as a "low melting point metal".

The content of the low melting point metal in the metal particles (A) is preferably 80% by mass or more, more preferably 85% by mass or more, further preferably 90% by mass or more, and particularly preferably 94% by mass or more based on 100% by mass of the total amount of the metal particles (A). It is presumed that the low melting point metal in the metal particles (A) forms alloys with objects having conductivity (a ground circuit, a reinforcing member on the ground side, and the like) at the interfaces during thermocompression bonding. Therefore, when the metal particles (A) include 80% by mass or more (particularly 90% by mass or more) of the low melting point metal, good conductivity is maintained even when the conductive adhesive is subjected to high temperature in a reflow step or the like. The content may be 100% by mass or may be 99.9% by mass or less or 99.6% by mass or less. When the content is 99.9% by mass or less, the metal particles (A) have a certain degree of hardness, and the metal particles (A) are not too compressed when high pressure is applied in a 170° C. environment, and it is easy to ensure conduction between objects. Such effects are exhibited particularly when the conductive adhesive is an anisotropic conductive adhesive.

The metal particles (A) preferably include tin as the low melting point metal. The content of tin in the metal particles (A) is preferably 30% by mass or more, more preferably 40% by mass or more, based on 100% by mass of the total amount of the metal particles (A). The content of tin in the metal particles (A) may be 80% by mass or more, 90% by mass or more, or 94% by mass or more. When the metal particles (A) include 30% by mass or more of tin, good conductivity is maintained even when the conductive adhesive is subjected to high temperature in a reflow step or the like. When the conductive adhesive layer is an anisotropic conductive adhesive, such an effect is better when the metal particles (A) include 80% by mass or more (particularly 90% by mass or more) of tin. The content is preferably 99.9% by mass or less, more preferably 99.6% by mass or less. When the content is 99.9% by mass or less, the metal particles (A) have a certain degree of hardness, and the metal particles (A) are not too compressed when high pressure is applied in a 170° C. environment, and it is easy to ensure conduction between objects.

The metal particles (A) may include a metal other than the low melting point metal (that is, a metal having a melting point of more than 300° C.) as a constituent metal from the viewpoint of better connection stability. Examples of such a metal include gold, silver, copper, platinum, nickel, zinc, lead, palladium, antimony, and alloys thereof. Among them, gold, silver, copper, platinum, nickel, and palladium are preferable. For each of the metals, only one may be included, or two or more may be included. The metal particles (A) may be an alloy of the above-described metal.

When the metal particles (A) include tin as a constituent metal, they may further include a further metal in addition to tin. Examples of the further metal include gold, silver, copper, platinum, nickel, zinc, lead, palladium, bismuth, antimony, indium, and alloys thereof. The metal particles (A) preferably include a metal having a higher melting point (or harder) than tin, such as bismuth, indium, gold, silver, copper, platinum, nickel, palladium, or antimony, as the further metal from the viewpoint of better connection stability. For each of the other metals, only one may be included, or two or more may be included. The metal particles (A) may be an alloy of the above-described metal.

Specific examples of the metal particles (A) include copper particles, silver particles, nickel particles, silver-coated copper particles, indium particles, tin particles, lead particles, bismuth particles, tin-containing alloy particles, gold-coated copper particles, silver-coated nickel particles, gold-coated nickel particles, indium-coated copper particles, tin-coated copper particles, lead-coated copper particles, tin-coated nickel particles, tin-coated alloy particles, gold-coated tin particles, silver-coated tin particles, bismuth-coated copper particles, indium-coated nickel particles, bismuth-coated nickel particles, tin-bismuth alloy particles, and silver-coated alloy particles. The metal particles (A) can be made by an electrolysis method, an atomization method, a reduction method, or the like.

Examples of the shape of the metal particles (A) include a spherical shape (a true spherical shape, a spheroidal shape, or the like), a flaky shape (scaly shape), a dendritic shape, a fibrous shape, and an irregular shape (polyhedron). Among them, a spherical shape is preferable from the viewpoint of the metal particles (A) being even less likely to rise towards the back side of an object even if pushed in.

The median diameter (D50) of the metal particles (A) is preferably 1 to 50 μm, more preferably 10 to 45 μm. When the median diameter is 1 μm or more, the conductivity is better. In addition, the dispersibility of the metal particles (A) is good, and aggregation can be suppressed. When the average particle diameter is 50 μm or less, the metal particles (A) are even less likely to rise towards the back side of an object even if pushed in.

The content of the metal particles (A) in the conductive adhesive is preferably 10 to 70% by mass, more preferably 15 to 60% by mass, and further preferably 20 to 50% by mass based on 100% by mass of the total amount of the conductive adhesive. When the content is 10% by mass or more, the conductivity is better. When the content is 70% by mass or less, the conductive adhesive is economically excellent, and the metal particles (A) are less likely to rise towards the back side of an object even if pushed in.

(Other Conductive Particles)

As the other conductive particles, known or commonly used conductive particles other than the metal particles (A) can be used. Examples of the other conductive particles include metal particles, metal-coated resin particles, metal fibers, carbon fillers, and carbon nanotubes. Among them, metal particles (that is, metal particles having a 20% compressive strength of more than 25 MPa in a 170° C. environment) are preferable. When the metal particles are used in combination with the metal particles (A), the metal particles (A) are not too compressed when high pressure is applied in a 170° C. environment, and the particle shape can be maintained, and the connection stability between objects is better, even when the compressive strength of the metal particles (A) at 170° C. is as low as less than 1 MPa. Only one type of the other conductive particles may be used, or two or more types of the other conductive particles may be used. As used herein, the metal particles having a 20% compressive strength of more than 25 MPa in a 170° C. environment are sometimes referred to as "metal particles (B)".

Examples of the metal constituting the metal particles (B) include those illustrated and described as the metal constituting the metal particles (A). Only one of the metal may be used, or two or more of the metals may be used.

Specific examples of the metal particles (B) include copper particles, silver particles, nickel particles, silver-coated copper particles, indium particles, tin particles, lead particles, bismuth particles, gold-coated copper particles, silver-coated nickel particles, gold-coated nickel particles, indium-coated copper particles, tin-coated copper particles, lead-coated copper particles, bismuth-coated copper particles, indium-coated nickel particles, tin-coated nickel particles, bismuth-coated nickel particles, and silver-coated alloy particles. Examples of the silver-coated alloy particles include silver-coated copper alloy particles in which alloy particles including copper (for example, copper alloy particles including an alloy of copper, nickel, and zinc) are coated with silver. As the metal particles (B), among them, silver particles, silver-coated copper particles, and silver-coated copper alloy particles are preferable. From the viewpoints of excellent conductivity, suppressing the oxidation and aggregation of the conductive particles, and being able to lower the cost of the conductive particles, particularly silver-coated copper particles and silver-coated copper alloy particles are preferable.

Examples of the shape of the metal particles (B) include a spherical shape (a true spherical shape, a spheroidal shape, or the like), a flaky shape (a scaly shape or a flat shape), a dendritic shape (dendrite shape), a fibrous shape, and an irregular shape (polyhedron). Among them, a flaky shape and a dendritic shape are preferable. The reason for this is as follows: by making the shape of the metal particles (B) flaky or dendritic, a posture in which the metal particles (B) overlap each other is likely to be taken, and thus the contact between the metal particles (B) increases, and the conductivity in the planar direction improves. As a result of this improvement of the conductivity in the planar direction combined with the conductivity of the metal particles (A) in the thickness direction, the conductivity of the entire conductive adhesive improves (is electrically stable), and the connection stability between objects can be more improved.

The median diameter (D50) of the metal particles (B) is preferably 0.5 to 25 µm, more preferably 3 to 10 µm. When the median diameter is 0.5 µm or more, the connection stability between objects is better. In addition, the dispersibility of the metal particles (B) is good, and aggregation can be suppressed. When the median diameter is 25 µm or less, the close adhesion strength of the conductive adhesive to objects is better.

The content of the metal particles (B) in the conductive adhesive is preferably 10 to 70% by mass, more preferably 15 to 60% by mass, and further preferably 20 to 50% by mass based on 100% by mass of the total amount of the conductive adhesive. When the content is 10% by mass or more, the conductivity of the conductive adhesive in the planar direction is more exhibited, and the connection stability between objects is better. When the content is 70% by mass or less, the flexibility of the conductive adhesive layer is excellent.

(Binder Component)

Examples of the binder component include thermoplastic resins, thermosetting type resins, and active energy ray-curable type compounds. Examples of the thermoplastic resins include polystyrene-based resins, vinyl acetate-based resins, polyester-based resins, polyolefin-based resins (for example, polyethylene-based resins and polypropylene-based resin compositions), polyimide-based resins, and acrylic resins. Only one of the thermoplastic resin may be used, or two or more of the thermoplastic resins may be used.

Examples of the thermosetting type resins include both of resins having thermosetting properties (thermosetting resins) and resins obtained by curing the thermosetting resins. Examples of the thermosetting resins include phenol-based resins, epoxy-based resins, urethane-based resins, melamine-based resins, and alkyd-based resins. Only one of the thermosetting type resin may be used, or two or more of the thermosetting type resins may be used.

Examples of the epoxy-based resins include bisphenol type epoxy-based resins, spiro ring type epoxy-based resins, naphthalene type epoxy-based resins, biphenyl type epoxy-based resins, terpene type epoxy-based resins, glycidyl ether type epoxy-based resins, glycidylamine type epoxy-based resins, and novolac type epoxy-based resins.

Examples of the bisphenol type epoxy resins include bisphenol A type epoxy resins, bisphenol F type epoxy resins, bisphenol S type epoxy resins, and tetrabromobisphenol A type epoxy resins. Examples of the glycidyl ether type epoxy resins include tris(glycidyloxyphenyl)methane and tetrakis(glycidyloxyphenyl)ethane. Examples of the glycidylamine type epoxy resins include tetraglycidyl-diaminodiphenylmethane. Examples of the novolac type epoxy resins include cresol novolac type epoxy resins, phenol novolac type epoxy resins, α-naphthol novolac type epoxy resins, and brominated phenol novolac type epoxy resins.

Examples of the active energy ray-curable type compounds include both of compounds that can be cured by active energy ray irradiation (active energy ray-curable compounds) and compounds obtained by curing the active energy ray-curable compounds. The active energy ray-curable compounds are not particularly limited, and examples thereof include polymerizable compounds having one or more (preferably two or more) radical reactive groups (for example, (meth)acryloyl groups) in the molecule. Only one of the active energy ray-curable type compound may be used, or two or more of the active energy ray-curable type compounds may be used.

As the binder component, among them, thermosetting type resins are preferable. In this case, after the conductive adhesive is disposed on an object such as a printed circuit board or a shielded printed circuit board subjected to electromagnetic wave shielding measures, the binder component can be cured by pressurization and heating, and the adhesiveness of the lamination portion is good. For example, when the binder component is a thermosetting resin, the binder component after thermocompression bonding is a thermosetting type resin in which the thermosetting resin is cured.

When the binder component includes a thermosetting type resin, it may include a curing agent for accelerating a thermal curing reaction, as a component constituting the binder component. The curing agent can be appropriately selected according to the type of the thermosetting resin. Only one of the curing agent may be used, or two or more of the curing agents may be used.

The content of the binder component in the conductive adhesive is not particularly limited and is preferably 15 to 95% by mass, more preferably 20 to 90% by mass, and further preferably 30 to 80% by mass based on 100% by mass of the total amount of the adhesive. When the content is 15% by mass or more, the close adhesiveness to objects is better. When the content is 95% by mass or less, the metal particles (A) can be sufficiently blended, and the conductivity is better.

The conductive adhesive may contain other components other than the above components within a range that does not impair the effects intended by the present disclosure. Examples of the other components include components included in known or commonly used adhesives. Examples of the other components include a curing accelerator, a plasticizer, a flame retardant, an antifoaming agent, a viscosity adjusting agent, an antioxidant, a diluent, an anti-settling agent, a filler, a colorant, a leveling agent, a coupling agent, an ultraviolet absorbing agent, a tackifier resin, and an anti-blocking agent. For the other components, only one may be used, or two or more may be used.

The thickness of the conductive adhesive is preferably 2 to 20 µm, more preferably 3 to 17 µm. When the thickness is 2 µm or more, the adhesive strength to objects is better. When the thickness is 20 µm or less, the cost can be reduced, and products including the conductive adhesive can be designed thin. The thickness of the conductive adhesive when parts of the metal particles (A) protrude from the conductive adhesive is the thickness in the region in which the metal particles (A) do not protrude. The thickness of the conductive adhesive when the adhesive component (binder component) constituting the conductive adhesive flows due to heating or the like and enters an opening formed in an object, or the like is the thickness of the adhesive in the region in which the adhesive component does not enter the opening.

The metal particles (A) may partially protrude from the conductive adhesive. For example, in the conductive adhesive before flowing or before curing, the metal particles (A) preferably partially protrude from the conductive adhesive. In this case, the thickness of the conductive adhesive (the region in which the metal particles (A) do not protrude) is preferably 10 to 30%, more preferably 12 to 25%, of the median diameter of the metal particles (A). When the thickness is 10% or more, the adhesiveness to objects is better. When the thickness is 30% or less, the proportion in which the metal particles (A) protrude from the conductive adhesive is large, and when a thick film portion is formed after flowing or after curing, it is easy to ensure conduction between objects adhered in the thick film portion.

For the conductive adhesive, the resistance value (initial resistance value) obtained by the following conductivity test is not particularly limited and is preferably 150 mΩ or less, more preferably 130 mΩ or less, further preferably 100 m) or less, and particularly preferably 80 mΩ or less. When the initial resistance value is 150 mΩ or less, the conduction between objects via the conductive adhesive is good.

[Conductivity Test]

The conductive adhesive is laminated on a SUS plate (thickness: 200 μm) by heating and pressurization under the conditions of temperature: 120° C. and pressure: 0.5 MPa for 5 s, the face on the conductive adhesive side is laminated on a printed circuit board for evaluation, and using a press machine, after evacuation for 60 s, the laminate is heated and pressurized under the conditions of temperature: 170° C. and pressure: 3.0 MPa for 30 min to prepare a board for evaluation. As the printed circuit board, a printed circuit board is used in which two copper foil patterns (thickness: 18 μm, line width: 3 mm) imitating a ground circuit are formed on a base member including a polyimide film having a thickness of 12.5 μm, and an insulating adhesive (thickness: 13 μm) and a coverlay including a polyimide film having a thickness of 25 μm are formed thereon. A circular opening simulating a ground connection portion having a diameter of 1 mm is formed in the coverlay. For the board for evaluation, the electrical resistance value between the copper foil patterns and the SUS plate is measured by a resistance meter and taken as the resistance value.

For the conductive adhesive, the resistance value (resistance value after reflow) obtained by the conductivity test, after passage through five cycles of a reflow step set in such a temperature profile that the conductive adhesive is exposed to hot air at 265° C. for 5 s, is not particularly limited and is preferably 150 mΩ or less, more preferably 50 mΩ or less, and further preferably 30 m) or less. When the resistance value is 150 mΩ or less, the conduction between objects via the conductive adhesive is good. The resistance value after reflow is measured in the same manner as the conductivity test for the initial resistance value, for the board for evaluation after passage through five cycles of the reflow step.

For the conductive adhesive, the resistance value change rate [(resistance value after reflow−initial resistance value)/initial resistance value×100] is not particularly limited and is preferably 80% or less, more preferably 50% or less, further preferably 10% or less, further preferably 0% or less, and particularly preferably −20% or less. When the resistance value change rate is 80% or less, a rise in the connection resistance value is less likely to occur even when the conductive adhesive is subjected to high temperature, and the connection stability between objects that are conductive members is better.

For the conductive adhesive, the degree of circularity obtained by the measurement of the degree of circularity is not particularly limited and is preferably 0.7 or more, more preferably 0.75 or more, and further preferably 0.8 or more. When the degree of circularity is 0.7 or more, the rising towards the back side of an object is small and less likely to interfere with close adhesiveness when a component is mounted on a printed circuit board to which the board for evaluation is applied. The degree of circularity is obtained from the following formula based on the back face shape of the opening (diameter 1 mm) of the board for evaluation made in the conductivity evaluation.

$$\text{degree of circularity} = 4\pi \times (\text{area})/(\text{peripheral length})^2$$

The conductive adhesive is preferably for printed circuit board applications, particularly preferably for flexible printed circuit board (FPC) applications. For the conductive adhesive, the connection stability between objects that are conductive members is excellent, the connection stability is maintained even when the conductive adhesive is subjected to high temperature, and rising towards the back side of an object is less likely to occur. For such effects, the effects are achieved, of course when the amount of conductive particles such as metal particles blended is large, and even when the amount is small, and the effects are also economically excellent. Therefore, the conductive adhesive can be preferably used as an electromagnetic wave shielding film or a conductive bonding film for a printed circuit board (particularly for an FPC). The conductive bonding film is intended for the attachment of a conductive (metal) reinforcing plate to a printed circuit board, and examples of the conductive bonding film also include a ground connection drawing film intended to allow electromagnetic waves that enter or are produced in a printed circuit board to escape externally.

A separate film may be stacked on at least one face of the conductive adhesive. That is, the conductive adhesive may be provided as a stack including a separate film and the conductive adhesive formed on the release face of the separate film. The separate film is peeled at the time of use.

The conductive adhesive can be manufactured by a known or commonly used manufacturing method. Examples include applying (coating) an adhesive composition forming the conductive adhesive on a temporary substrate or a substrate such as a separate film, and removing the solvent and/or partially cure the adhesive composition, as needed, to form the conductive adhesive.

The adhesive composition includes, for example, a resolvent (solvent), in addition to the components included in the conductive adhesive. Examples of the resolvent include toluene, acetone, methyl ethyl ketone, methanol, ethanol, propanol, and dimethylformamide. The solid concentration of the adhesive composition is appropriately set according to the thickness of the conductive adhesive to be formed, and the like.

For the application of the adhesive composition, a known coating method may be used. For example, a coater such as a gravure roll coater, a reverse roll coater, a kiss roll coater, a lip coater, dip roll coater, a bar coater, a knife coater, a spray coater, a comma coater, a direct coater, or a slot die coater may be used.

[Printed Circuit Board with Reinforcing Member]

Figure 2:
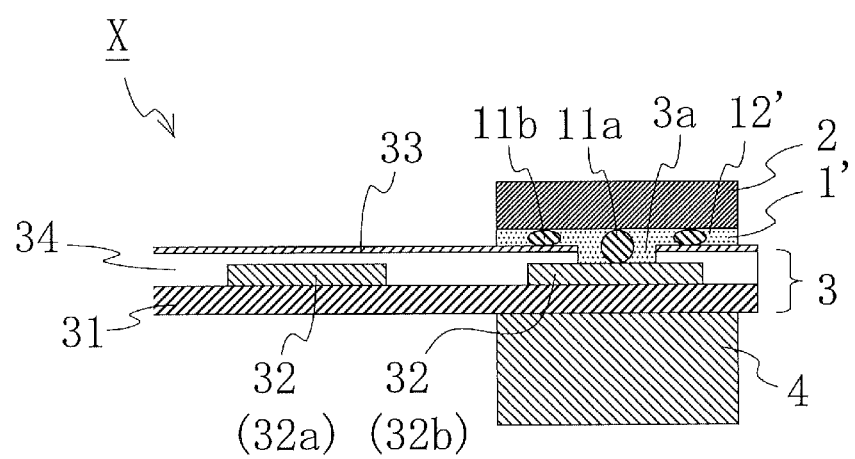
FIG. 2 is a cross-sectional view showing one embodiment of a printed circuit board with a reinforcing member to which the conductive adhesive of the present disclosure is applied.

FIG. 2 shows an example in which the conductive adhesive is applied to a printed circuit board with a reinforcing member. As shown in FIG. 2, a printed circuit board with a reinforcing member X that is one embodiment of a printed circuit board with a reinforcing member includes a printed circuit board 3, a conductive adhesive 1' provided on the printed circuit board 3, and a reinforcing member 2 having conductivity provided on the conductive adhesive 1'.

The printed circuit board 3 has a base member 31, a circuit pattern 32 partially provided on a surface of the base member 31, an insulating protective layer 33 covering and insulating and protecting the circuit pattern 32, and an adhesive 34 for covering the circuit pattern 32 and adhering the circuit pattern 32 and the base member 31 to the insulating protective layer 33. The circuit pattern 32 includes a plurality of signal circuits 32a and a ground circuit 32b. An opening (through hole) 3a passing through the adhesive 34 and the insulating protective layer 33 in the thickness direction is formed in the adhesive 34 and the insulating protective layer 33 on the ground circuit 32b.

The conductive adhesive 1' is adhered to the insulating protective layer 33 surface of the printed circuit board 3 so as to cover and block the opening 3a, and a binder component (adhesive component) 12' fills the opening 3a. The conductive adhesive 1' is formed of metal particles (A) 11a and 11b and the binder component (adhesive component) 12'. The conductive adhesive 1' has a thick film portion in which the thickness of the adhesive is relatively thick, and a thin film portion in which the thickness of the adhesive is relatively thin. The thick film portion corresponds to the portion filling the opening 3a, and the thin film portion corresponds to the portion located between the insulating protective layer 33 and the reinforcing member 2. The metal particles (A) 11a in the thick film portion are located between the reinforcing member 2 and the ground circuit 32b and preferably provides conduction between the reinforcing member 2 and the ground circuit 32b while being in contact with them. The thickness of the adhesive in the thick film portion is, for example, 50% or more (preferably 70% or more, more preferably 90% or more) of the maximum particle diameter of the metal particles (A) 11a in the adhesive thickness direction in the thick film portion. The metal particles (A) 11b in the thin film portion are located between the reinforcing member 2 and the insulating protective layer 33, compressively deformed by pressure, and preferably in contact with the reinforcing member 2 and the insulating protective layer 33. The thickness of the adhesive in the thin film portion is, for example, 50% or more (preferably 70% or more, more preferably 90% or more) of the maximum particle diameter of the metal particles (A) 11b in the adhesive thickness direction in the thin film portion. With the printed circuit board with the reinforcing member X having such a structure, the ground member 32b and the reinforcing member 2 are brought into conduction via the metal particles (A) 11a, the reinforcing member 2 functions as an external connection conductive layer, and the reinforcing member 2 surface is electrically connected to an external ground member. In addition, when thermocompression bonding is performed in order to form the conductive adhesive 1', the metal particles (A) 11 are compressively deformed and therefore less likely to rise towards the back side of the base member 31 on which the ground circuit 32b is formed. As a result, this is less likely to interfere with the close adhesiveness between the printed circuit board 3 and an electronic component 4 when the electronic component 4 is mounted. Further, it is presumed that when the metal particles (A) 11a include a low melting point metal, the low melting point metal forms alloys with the ground circuit 32b and the reinforcing member 2 at the interfaces of these during thermocompression bonding, and the connection stability is better.

The conductive adhesive 1' can be obtained, for example, as follows: the conductive adhesive 1 before flowing or curing that forms the conductive adhesive 1' is laminated on a surface of the reinforcing member 2 as needed, then laminated on the insulating protective layer 33 in the printed circuit board 3, and subsequently thermocompression-bonded by flowing or curing the binder component 12 by heating, and thus the metal particles (A) 11 are sandwiched between the reinforcing member 2 and the insulating protective layer 33 and compressively deformed to form the metal particles (A) 11b, and while the binder component (adhesive component) 12 is adhered to the insulating protective layer 33, the binder component 12 is flowed to fill the opening 3a, and cured as needed, to form the binder component 12'. Both the conductive adhesive 1' and the conductive adhesive 1 before flowing or curing that forms the conductive adhesive 1' apply to the conductive adhesive of the present disclosure.

The mounting site provided on the face of the printed circuit board 3 opposite to the reinforcing member 2 is adapted so that the electronic component 4 is connected to the mounting site. The reinforcing member 2 is disposed opposed to the mounting site to which the electronic component 4 is to be connected. Thus, the reinforcing member 2 reinforces the mounting site for the electronic component 4. The reinforcing member 2 having conductivity is electrically connected to the ground circuit 32b in the printed circuit board 3 via the conductive adhesive 1'. Thus, the reinforcing member 2 is kept at the same potential as the ground circuit 32 and therefore shields the mounting site for the electronic component 4 from external noise such as electromagnetic waves.

For the conductive adhesive 1', the connection stability between objects that are conductive members (that is, the reinforcing member 2 and the ground circuit 32b) is excellent, the connection stability is maintained even when the conductive adhesive 1' is subjected to high temperature, and rising towards the back side (that is, the face on which the electronic component 4 is to be mounted) of the ground circuit 32b and the base member 31 that are objects is less likely to be caused. Therefore, when thermocompression bonding is performed in order to form the conductive adhesive 1', the metal particles (A) 11 are less likely to rise towards the back side of the base member 31 on which the ground circuit 32b is formed, even if pushed in. As a result, this is less likely to interfere with the close adhesiveness between the printed circuit board 3 and the electronic component 4 when the electronic component 4 is mounted.

EXAMPLES

One embodiment of the conductive adhesive of the present disclosure will be described in more detail below based on Examples, but the conductive adhesive of the present disclosure is not limited only to these Examples.

Example 1

65 Parts by mass of a bisphenol A type epoxy-based resin (trade name "jER1256", manufactured by Mitsubishi Chemical Corporation), 0.05 parts by mass of a curing agent (trade name "ST14", manufactured by Mitsubishi Chemical Corporation), and 35 parts by mass of metal particles were blended in toluene so that the amount of solids was 20% by mass, and the blend was stirred and mixed to prepare an adhesive composition. The properties of the metal particles are as shown in Table 1. The obtained adhesive composition was applied to the release-treated face of a PET film having a surface release-treated, and the solvent was removed by heating to form an anisotropic conductive adhesive.

Examples 2 to 8 and Comparative Examples 1 to 3

Anisotropic conductive adhesives were made in the same manner as Example 1 except that the type of the metal particles in the conductive adhesive and the thickness of the conductive adhesive were changed as shown in Table 1. The properties of the metal particles used in each example are as shown in Table 1, and the ratios in the composition represent mass ratios.

Example 9

35.75 Parts by mass of a bisphenol A type epoxy-based resin (trade name "jER1256", manufactured by Mitsubishi Chemical Corporation), 0.05 parts by mass of a curing agent (trade name "ST14", manufactured by Mitsubishi Chemical Corporation), 29.25 parts by mass of a silver-coated copper powder (median diameter: 5 μm), and 35 parts by mass of metal particles were blended in toluene so that the amount of solids was 20% by mass, and the blend was stirred and mixed to prepare an adhesive composition. The properties of the metal particles are as shown in Table 2. The obtained adhesive composition was applied to the release-treated face of a PET film having a surface release-treated, and the solvent was removed by heating to form an isotropic conductive adhesive.

Examples 10 to 15 and Comparative Example 4

Isotropic conductive adhesives were made in the same manner as Example 9 except that the type of the metal particles (the metal particles other than the silver-coated copper powder) in the conductive adhesive and the thickness of the conductive adhesive were changed as shown in Table 2. The properties of the metal particles used in the examples are as shown in Table 2, and the ratios in the composition represent mass ratios.
(Evaluation)
The metal particles (the metal particles other than the silver-coated copper powder) used in the Examples and the Comparative Examples, and the conductive adhesives obtained in the Examples and the Comparative Examples were evaluated as follows. The evaluation results are described in Table 1 and Table 2.
(1) Median Diameter
The median diameter of metal particles was measured using a flow type particle image analysis apparatus (trade name "FPIA-3000", manufactured by SYSMEX CORPORATION). Specifically, measurement was performed using objective lens 10× by a bright field optical system in the LPF measurement mode with a metal particle dispersion adjusted at a concentration of 4000 to 20000 particles/μl. The metal particle dispersion was prepared by adding 0.1 to 0.5 ml of a surfactant to a sodium hexametaphosphate aqueous solution adjusted at 0.2% by mass, and adding 0.1±0.01 g of metal particles that were a measurement sample. The suspension in which the metal particles were dispersed was subjected to 1 to 3 min dispersion treatment by an ultrasonic disperser and subjected to the measurement. The median diameter of the metal particles obtained by the measurement is shown in Table 1 and Table 2.
(2) 20% Compressive Strength in 170° C. Environment
The 20% compressive strength in a 170° C. environment was measured in accordance with JIS Z 8844: 2019. Specifically, measurement was performed using a microcompression tester (model "MCT-510", manufactured by SHIMADZU CORPORATION) with a φ 50 μm tip terminal in a 170° C. environment at a test speed of 4 mN/sec to 15 mN/sec (appropriately changed according to the hardness of the particles).
(3) Conductivity Test
Each of the conductive adhesives made in the Examples and the Comparative Examples was laminated on a SUS plate (thickness: 200 μm) that was a reinforcing member by heating and pressurization under the conditions of temperature: 120° C. and pressure: 0.5 MPa for 5 s, the PET film on the conductive adhesive was peeled, the face on the conductive adhesive side was laminated on a printed circuit board for evaluation, and using a press machine, after evacuation for 60 s, the laminate was heated and pressurized under the conditions of temperature: 170° C. and pressure: 3.0 MPa for 30 min to make a board for evaluation. The printed circuit board has two copper foil patterns (thickness: 18 μm, line width: 3 mm) extending parallel to each other at an interval, and an insulating protective layer (thickness: 25 μm) covering the copper foil patterns and including an insulating adhesive (thickness: 13 μm) and a polyimide having a thickness of 25 μm, on a base member including a polyimide film having a thickness of 12.5 μm, and an opening (diameter: 1 mm) having a cylindrical shape exposing the copper foil patterns is provided in the insulating protective layer. This opening was adapted to be completely covered with the conductive adhesive when the conductive adhesive and the printed circuit board were superposed on each other. The electrical resistance value between the copper foil patterns and SUS plate of the obtained board for evaluation was measured using a resistance meter and taken as the resistance value (initial resistance value) between the printed circuit board and the SUS plate before reflow.

Next, heat treatment in which reflow treatment was assumed was performed, and the electrical resistance value after reflow was measured (resistance value after reflow). These heat treatment and the measurement of the electrical resistance value were repeated five times. Considering the use of lead-free solder, the temperature profile was set so that the conductive adhesive in the board for evaluation was exposed to 265° C. for 5 s. The initial resistance value, the resistance value after reflow, and the resistance value change rate [(resistance value after reflow−initial resistance value)/initial resistance value×100] are each shown in Table 1 and Table 2.
(4) Degree of Circularity
The back face shape of the opening (diameter 1 mm) of the board for evaluation made in order to evaluate the (3) Conductivity Test was observed by a microscope ("VHX-5000", manufactured by KEYENCE CORPORATION), the peripheral length and area of the opening were measured using the image analysis software attached to the microscope, and the degree of circularity was obtained from the following formula. The result is shown in Table 1 and Table 2. The degree of circularity is an indicator indicating closeness to a circle, and as the degree of circularity becomes higher, the two-dimensional shape becomes closer to a circle, and when the degree of circularity is 1.0, it is indicated that the shape is a true circle. Therefore, as the degree of circularity becomes higher, it is indicated that the shape of the opening bottom face is maintained, and as the degree of circularity becomes smaller, it is indicated that the rising due to the metal particles occurs, and the shape of the opening bottom face is not maintained.

$$\text{degree of circularity} = 4\pi \times (\text{area})/(\text{peripheral length})^2$$

[Table 1]

TABLE 1

|  |  | Examples | | Comparative Examples | | | Examples | | | | | |
| --- | --- | --- | --- | --- | --- | --- | --- | --- | --- | --- | --- | --- |
|  |  | 1 | 2 | 1 | 2 | 3 | 3 | 4 | 5 | 6 | 7 | 8 |
| Metal particles | Content [% by mass] | 35 | 35 | 35 | 35 | 35 | 35 | 35 | 35 | 35 | 35 | 35 |
|  | 20% compressive strength in 170° C. environment [MPa] | 17.1 | 20.0 | 65.4 | 26.3 | 92.9 | <1.0 | 16.3 | 11.2 | 11.9 | 16.6 | 17.1 |
|  | Median diameter [μm] | 35.0 | 29.0 | 36.5 | 63.0 | 36.5 | 35.0 | 29.0 | 29.0 | 35.0 | 35.0 | 35.0 |
|  | Composition | In8/Ag3/Bi0.5/Sn88.5 | Ag3.5/Cu0.75/Sn95.75 | AgCu | Al | Sn-plated Cu particles (Sn20/Cu80) | Bi58/Sn42 | Ag1/Cu0.5/Sn98.5 | Cu0.7/Ag0.3/Sn99 | Cu0.7/Ni0.06/P0.003/Sn99.2 | Ag4/Cu0.5/Sn95.5 | Sb10/Sn90 |
| Adhesive thickness [μm] | | 15.2 | 6.4 | 13.2 | 14.0 | 16.0 | 6.8 | 3.6 | 4.8 | 6.0 | 5.6 | 6.0 |
| [Adhesive thickness/median diameter of metal particles] [%] | | 43.4 | 22.1 | 36.2 | 22.2 | 43.8 | 19.4 | 12.4 | 16.6 | 17.1 | 16.0 | 17.1 |
| Evaluation | Degree of circularity | 0.86 | 0.83 | *1 | *1 | *2 | 0.91 | 0.89 | 0.92 | 0.77 | 0.77 | 0.82 |
|  | Initial resistance value [mΩ] | 93 | 17 | 4 | 4002 | 3 | 136 | 12 | 7 | 26 | 9 | 56 |
|  | Resistance value after reflow [mΩ] | 133 | 10 | 408 | 3690 | 5 | 52 | 8 | 3 | 15 | 16 | 11 |
|  | Resistance value change rate [%] | 43 | −41 | 10100 | −8 | 67 | −62 | −33 | −57 | −42 | 78 | −80 |

*1 The shape of the circle was not maintained, and measurement was impossible.
*2 The position of the opening was not distinguished, and measurement was impossible.

TABLE 2

|  |  | Examples | | Comparative Examples | Examples | | | | |
| --- | --- | --- | --- | --- | --- | --- | --- | --- | --- |
|  |  | 9 | 10 | 4 | 11 | 12 | 13 | 14 | 15 |
| Metal particles | Content [% by mass] | 35 | 35 | 35 | 35 | 35 | 35 | 35 | 35 |
|  | 20% compressive strength in 170° C. environment [MPa] | 17.1 | 20.0 | 92.9 | <1.0 | 16.3 | 11.2 | 11.9 | 17.1 |
|  | Median diameter [μm] | 35.0 | 29.0 | 36.5 | 35.0 | 29.0 | 29.0 | 35.0 | 35.0 |
|  | Composition | In8/Ag3/Bi0.5/Sn88.5 | Ag3.5/Cu0.75/Sn95.75 | Sn-plated Cu particles (Sn20/Cu80) | Bi58/Sn42 | Ag1/Cu0.5/Sn98.5 | Cu0.7/Ag0.3/Sn99 | Cu0.7/Ni0.06/P0.003/Sn99.2 | Sb10/Sn90 |

TABLE 2-continued

|  |  | Examples | | Comparative Examples | Examples | | | | |
| --- | --- | --- | --- | --- | --- | --- | --- | --- | --- |
|  |  | 9 | 10 | 4 | 11 | 12 | 13 | 14 | 15 |
| Adhesive thickness [μm] | | 15.2 | 6.4 | 16.0 | 6.8 | 3.6 | 4.8 | 6.0 | 6.0 |
| [Adhesive thickness/ median diameter of metal particles] [%] | | 43.4 | 22.1 | 43.8 | 19.4 | 12.4 | 16.6 | 17.1 | 17.1 |
| Evaluation | Degree of circularity | 0.92 | 0.89 | *2 | 0.93 | 0.92 | 0.92 | 0.92 | 0.89 |
|  | Initial resistance value [mΩ] | 3 | 3 | 3 | 6 | 5 | 4 | 6 | 5 |
|  | Resistance value after reflow [mΩ] | 15 | 11 | 9 | 18 | 14 | 9 | 21 | 12 |
|  | Resistance value change rate [%] | 400 | 267 | 200 | 200 | 180 | 125 | 250 | 140 |

*2 The position of the opening was not distinguished, and measurement was impossible.

The conductive adhesives of the Examples were evaluated as follows: the initial resistance value was small, the connection stability between the objects that were conductive members was excellent, and the degree of circularity was large, and rising towards the back side of the object was less likely to occur. In addition, the conductive adhesives of the Examples were evaluated as follows: the resistance value after reflow and the resistance value change rate were also small, and good conductivity was maintained even when the conductive adhesives were subjected to high temperature. On the other hand, when the 20% compressive strength in a 170° C. environment was high (Comparative Examples 1 to 4), rising towards the back side of the object occurred, and the degree of circularity could not be measured. Specifically, in Comparative Examples 1 and 2, due to rising towards the back side of the object, the shape of the circle for which the degree of circularity was to be measured was lost, and the measurement was impossible, and in Comparative Examples 3 and 4, due to many rising towards the back side of the object, the circle for which the degree of circularity was to be measured could not be recognized, and the measurement was impossible. In addition, from the comparison of Example 1 and Example 2, when the content of tin in the metal particles (A) was high, the resistance value change rate was lower.

REFERENCE SIGNS LIST

X printed circuit board with a reinforcing member
1, 1' conductive adhesive
11, 11a, 11b metal particles (A)
12, 12' binder component (adhesive component)
2 reinforcing member
3 printed circuit board
31 base member
32 circuit pattern
32a signal circuit
32b ground circuit
33 insulating protective layer
34 adhesive
4 electronic component

The invention claimed is:

1. A conductive adhesive comprising a binder component, and metal particles having a 20% compressive strength of 1 to 25 MPa in a 170° C. environment.

2. The conductive adhesive according to claim 1, wherein the metal particles comprise a metal having a melting point of 280° C. or less.

3. The conductive adhesive according to claim 2, wherein a content of the metal having a melting point of 280° C. or less in the metal particles is 80% by mass or more.

4. The conductive adhesive according to claim 1, wherein a content of the metal particles is 10 to 70% by mass.

5. The conductive adhesive according to claim 1, wherein the metal particles comprise tin and a metal having a higher melting point than tin as constituent metals.

6. The conductive adhesive according to claim 5, wherein the metal having a higher melting point than tin comprises bismuth, indium, gold, silver, copper, platinum, nickel, palladium, or antimony.

7. The conductive adhesive according to claim 1, wherein the metal particles are spherical.

8. The conductive adhesive according to claim 1, wherein a median diameter of the metal particles is 1 to 50 μm.

9. The conductive adhesive according to claim 1, wherein the metal particles comprise tin-containing alloy particles.

10. The conductive adhesive according to claim 1, wherein the conductive adhesive is for a printed circuit board.

11. The conductive adhesive according to claim 1, wherein the metal particles partially protrude from the adhesive, and a thickness of the adhesive is 10 to 30% of the median diameter of the metal particles.

12. The conductive adhesive according to claim 1, having a thick film portion and a thin film portion, wherein
 a thickness of the adhesive in the thick film portion is 50% or more of a maximum particle diameter of the metal particles in an adhesive thickness direction in the thick film portion, and
 a thickness of the adhesive in the thin film portion is 50% or more of a maximum particle diameter of the metal particles in the adhesive thickness direction in the thin film portion.

13. A printed circuit board with a reinforcing member, comprising
 a printed circuit board,
 the conductive adhesive according to claim 12 provided on the printed circuit board, and
 a reinforcing member having conductivity provided on the conductive adhesive, wherein the printed circuit board has a base member, a circuit pattern partially provided on a surface of the base member, an insulating protective layer covering and insulating and protecting the circuit pattern, and an adhesive for covering the circuit pattern and adhering the circuit pattern and the base member to the insulating protective layer, the circuit pattern comprises a plurality of signal circuits and a ground circuit, an opening passing through the adhesive and the insulating protective layer in a thickness direction is formed in the adhesive and the insulating protective layer on the ground circuit, and the conductive adhesive is adhered to the insulating protective layer surface of the printed circuit board so as to cover and block the opening, and the thick film portion of the conductive adhesive fills the opening.

14. The printed circuit board with a reinforcing member according to claim 13, wherein in the thick film portion, the metal particles are in contact with the reinforcing member and the ground circuit, and in the thin film portion, the metal particles are in contact with the reinforcing member and the insulating protective layer.

\* \* \* \* \*